United States Patent
Nakazawa et al.

(10) Patent No.: US 9,659,774 B2
(45) Date of Patent: May 23, 2017

(54) IMPURITY INTRODUCING METHOD, IMPURITY INTRODUCING APPARATUS, AND METHOD OF MANUFACTURING SEMICONDUCTOR ELEMENT

(71) Applicant: Fuji Electric Co., Ltd., Kanagawa (JP)

(72) Inventors: Haruo Nakazawa, Nagano (JP); Kenichi Iguchi, Nagano (JP); Masaaki Ogino, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 14/729,491

(22) Filed: Jun. 3, 2015

(65) Prior Publication Data

US 2016/0005606 A1 Jan. 7, 2016

(30) Foreign Application Priority Data

Jul. 4, 2014 (JP) .................................. 2014-138889

(51) Int. Cl.
*H01L 21/268* (2006.01)
*H01L 21/04* (2006.01)

(52) U.S. Cl.
CPC ........ *H01L 21/0455* (2013.01); *H01L 21/268* (2013.01)

(58) Field of Classification Search
None
See application file for complete search history.

(56) References Cited

U.S. PATENT DOCUMENTS

| | | | | |
|---|---|---|---|---|
| 5,849,043 | A * | 12/1998 | Zhang | B60R 25/066 250/453.11 |
| 5,918,140 | A * | 6/1999 | Wickboldt | H01L 21/2254 257/E21.148 |
| 2003/0042397 | A1* | 3/2003 | Tatsuki | H01L 29/66765 250/200 |
| 2006/0246694 | A1* | 11/2006 | Talwar | B23K 26/0604 438/487 |
| 2007/0134893 | A1* | 6/2007 | Hatano | H01L 27/1285 438/488 |
| 2008/0045041 | A1* | 2/2008 | Nakao | H01L 21/268 438/795 |

(Continued)

OTHER PUBLICATIONS

K. Affolter et al., Properties of laser-assisted doping in silicon, Applied Physics Letters 33, 185 (1978).*

(Continued)

*Primary Examiner* — Charles Garber
*Assistant Examiner* — Alia Sabur
(74) *Attorney, Agent, or Firm* — Chen Yoshimura LLP

(57) ABSTRACT

A method for introducing impurity into a semiconductor substrate includes bringing a solution containing a compound of an impurity element into contact with a primary surface of a semiconductor substrate; and irradiating the primary surface of the semiconductor substrate with a laser beam through the solution to raise a temperature of the primary surface of the semiconductor substrate at a position irradiated by the laser beam so as to dope the impurity element into the semiconductor substrate. The laser beam irradiation is performed such that the raised temperature does not return to room temperature until a prescribed dose of the impurity element is caused to be doped into the semiconductor substrate.

22 Claims, 9 Drawing Sheets

(56) References Cited

U.S. PATENT DOCUMENTS

| | | | | |
|---|---|---|---|---|
| 2010/0144079 A1* | 6/2010 | Mayer | ............ | C25D 5/024 |
| | | | | 438/57 |
| 2010/0197061 A1* | 8/2010 | Huh | ............ | H01L 31/068 |
| | | | | 438/45 |
| 2010/0213166 A1* | 8/2010 | Kray | ............ | H01L 21/268 |
| | | | | 216/37 |
| 2011/0269263 A1* | 11/2011 | Kang | ............ | H01L 21/228 |
| | | | | 438/98 |

OTHER PUBLICATIONS

R. Stuck et al., Laser-induced diffusion by irradiation of silicon dipped into an organic solution of the dopant, Applied Physics Letters 38, 715 (1981).*

Ikeda et al., "Phosphorus doping of 4H SiC by liquid immersion excimer laser irradiation", Applied Physics Letters, 2013, vol. 102, pp. 052104-1-052104-4.

Nishi et al., "Phosphorus Doping into 4H—SiC by Irradiation of Excimer Laser in Phosphoric Solution", Japanese Journal of Applied Physics, 2013, vol. 52, pp. 06GF02-1-06GF02-4.

* cited by examiner

IMPURITY INTRODUCING METHOD, IMPURITY INTRODUCING APPARATUS, AND METHOD OF MANUFACTURING SEMICONDUCTOR ELEMENT

BACKGROUND OF THE INVENTION

Technical Field

The present invention relates to an impurity introducing method, an impurity introducing apparatus, and a method of manufacturing a semiconductor element.

Background Art

Semiconductor elements using silicon carbide (SiC), and 4H silicon carbide (4H—SiC) in particular, are showing promise as power semiconductors. A 4H—SiC semiconductor element is normally manufactured by doping a semiconductor substrate on which is formed a 4H—SiC crystal layer expitaxially grown at a desired density with an impurity element such as phosphorus (P), aluminum (Al), or the like. More specifically, for example, the semiconductor substrate is implanted with accelerated impurity element ions, and the semiconductor substrate is then subjected to a heating process (annealing) to restore the crystal structure of the ion-implanted semiconductor substrate and activate the impurity element.

Here, in the case where a (0001) surface (a (000-1) surface) of 4H—SiC is implanted with a high dose of ions (approximately $10^{15}/cm^2$, for example), it is necessary to carry out a heating process that heats the semiconductor substrate to approximately 300-800 degrees in advance. This is because recrystallization of the 4H—SiC and the activation of the impurity element will not occur effectively without the advance heating process.

SiC annealing is carried out at a higher temperature than for silicon (Si), at approximately 1600-1800 degrees, and such annealing is known to cause Si to fall from the surface of the semiconductor element, induce roughness in the surface of the semiconductor element due to migration, and so on. Accordingly, there is a method that carries out annealing after first forming a protective film of aluminum nitride (AlN), carbon (C), or the like on the surface of the semiconductor element, but such a method is problematic in that forming and removing the protective layer increases the number of processes and furthermore increases processing costs. Surrounding areas being soiled by aluminum (Al), carbon (C), or the like is also a problem of concern.

The laser doping technique disclosed in Non-patent Document 1 can be considered as a method for solving the aforementioned problems. In Non-patent Document 1, a 4H—SiC semiconductor substrate is immersed in an aqueous solution containing an impurity element and a border region between a surface of the semiconductor substrate and the solution is irradiated with laser beam pulses, locally heating the semiconductor substrate and doping the semiconductor substrate with the impurity element present in the solution. A beam having a wavelength in the ultraviolet range, which has a high absorption coefficient with respect to SiC, is used as this laser beam. According to Non-patent Document 1, doping can be carried out with the implantation of the impurity element and the activation of the semiconductor substrate occurring simultaneously, even in an environment equivalent to room temperature, and thus subjecting the semiconductor substrate to the advance heating process and post-impurity element implantation annealing as described above is considered unnecessary.

However, the technique of Non-patent Document 1 has a problem in that the impurity element can only penetrate the semiconductor substrate to a maximum depth of approximately 40 nm from the surface thereof. This is the same regardless of whether a single irradiation target region is irradiated with a single shot of the laser beam pulse or one hundred shots of the laser beam pulse.

RELATED ART DOCUMENT

Non-Patent Document

Non-patent Document 1: Ikeda, Akihiro et al, "Phosphorus doping of 4H SiC by liquid immersion excimer laser irradiation", Applied Physics Letters, Vol. 102, pp 052104-1-052104-4 (January 2013)

SUMMARY OF THE INVENTION

Having been achieved in light of the aforementioned problems, it is an object of the present invention to provide an impurity introducing method, an impurity introducing apparatus, and a method of manufacturing a semiconductor element capable of increasing a penetration depth of an impurity element in the case of laser doping using an impurity element in a solution.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a method for introducing impurity into a semiconductor substrate, including: bringing a solution containing a compound of an impurity element into contact with a primary surface of a semiconductor substrate; and irradiating the primary surface of the semiconductor substrate with a laser beam through the solution to raise a temperature of the primary surface of the semiconductor substrate at a position irradiated by the laser beam so as to dope the impurity element into the semiconductor substrate, wherein the laser beam irradiation is performed such that the raised temperature does not return to room temperature until a prescribed dose of the impurity element is caused to be doped into the semiconductor substrate.

In addition, in one aspect, the present disclosure provides an impurity introducing apparatus that includes: a solution vessel configured to store therein a solution containing a compound of an impurity element and configured to hold a semiconductor substrate upon a bottom surface thereof; a support platform that supports the solution vessel; and a laser optical system, including an optical fiber having one end face configured to be disposed within the solution adjacent to a primary surface of the semiconductor substrate so as to raise a temperature of the primary surface of the semiconductor substrate by inputting a laser beam into the optical fiber and irradiating the semiconductor substrate with the laser beam emerging from the one end face of the optical fiber through the solution located between the one end face and the semiconductor substrate, thereby doping the impurity element into the semiconductor substrate.

Thus the impurity introducing method and the impurity introducing apparatus according to at least one aspect of the present disclosure can, in the case where laser doping is carried out using an impurity element in a solution, provide a laser doping technique capable of extending a penetration depth of the impurity element.

Meanwhile, the method of manufacturing a semiconductor element according to at least one aspect of the present invention makes it easy, in the case where laser doping is carried out on a rear surface of the semiconductor element, to cause an impurity element to penetrate deeply and increase the concentration of an impurity element implanted (added) layer across the entire rear surface.

It is to be understood that both the foregoing general description and the following detailed description are exemplary and explanatory, and are intended to provide further explanation of the invention as claimed.

DETAILED DESCRIPTION OF EMBODIMENTS

Figure 1:
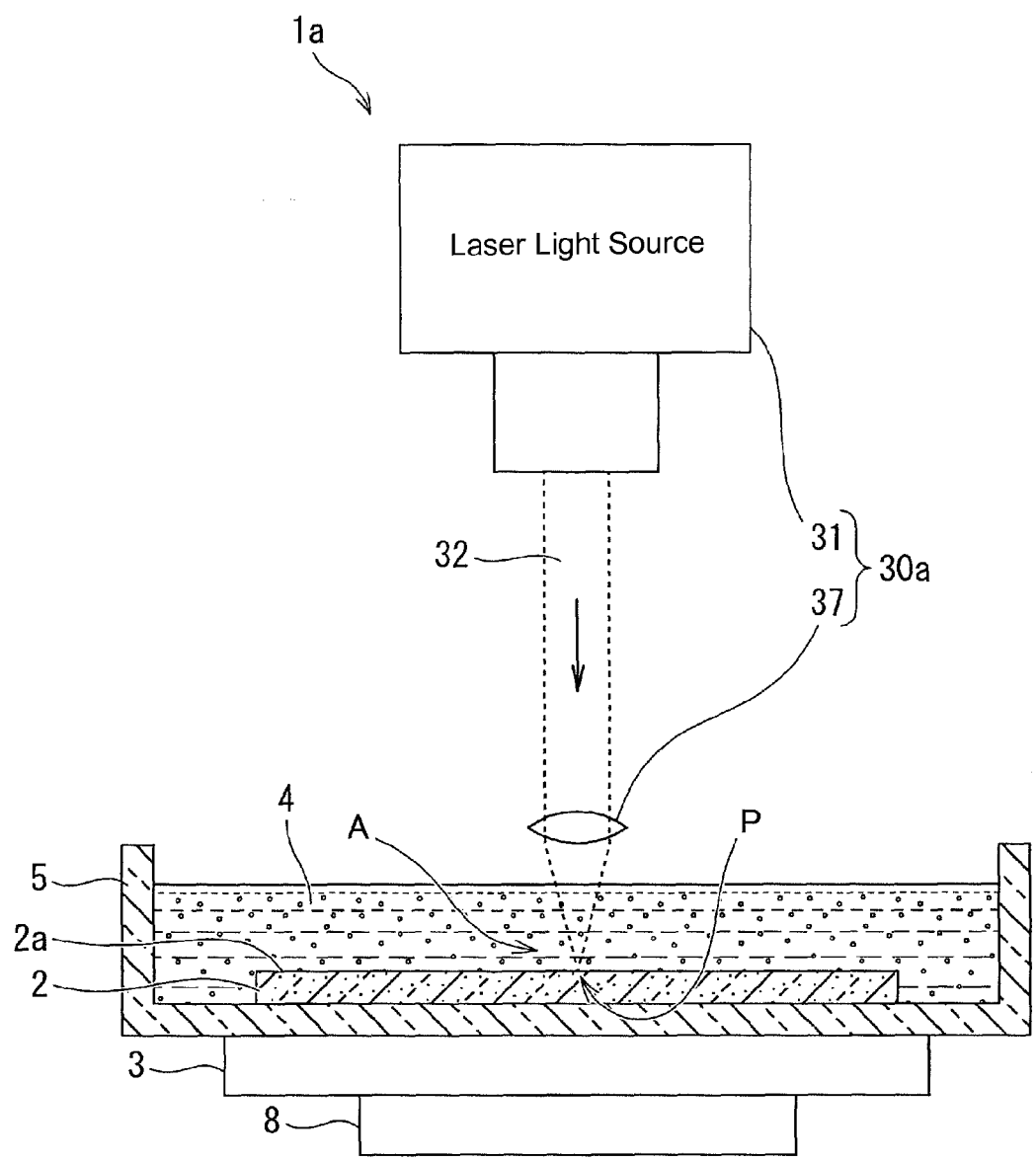
FIG. 1 is a partial cross-sectional view schematically illustrating, from the side, an impurity introducing apparatus used in an impurity introducing method according to Embodiment 1 of the present invention.

The respective units, the shapes, sizes, or ratios of members, and so on that constitute impurity introducing apparatuses according to the respective Embodiments of the present invention described below will be illustrated in simplified and exaggerated manners as appropriate for descriptive purposes.

First, an impurity introducing method according to Embodiment 1 of the present invention will be described. The impurity introducing method according to Embodiment 1 introduces an impurity element into part of an interior of a semiconductor substrate 2 using an impurity introducing apparatus 1a illustrated in FIG. 1, for example. The impurity introducing method according to Embodiment 1 includes forming a solution-present region A in which a solution 4 is present by bringing the solution 4, which contains an impurity element compound, into contact with a top surface 2a serving as a primary surface of the semiconductor substrate 2 at room temperature. The impurity introducing method according to Embodiment 1 also includes irradiating the top surface 2a of the semiconductor substrate 2 with a laser beam 32 through the solution 4 and raising a temperature of an irradiation position P irradiated by the laser beam 32. In the impurity introducing method according to Embodiment 1, a waveform of the laser beam 32 is set so that the raised temperature at the irradiation position P does not return to a room temperature K up until a time t3 at which the entire irradiation of the irradiation position P with the laser beam 32 has ended, as indicated in FIGS. 2a and 2B.

Figure 2A:
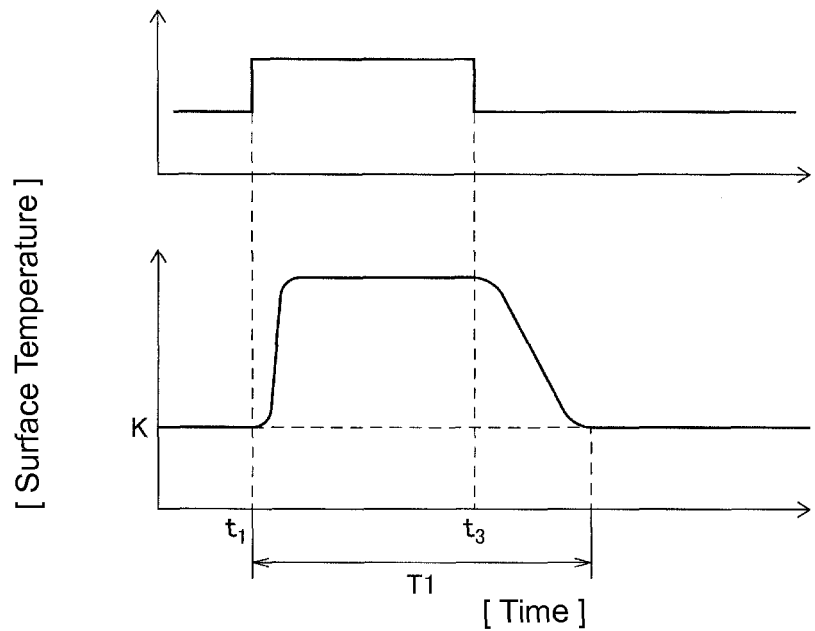
FIGS. 2A and 2B are diagrams illustrating changes over time in a surface temperature of a position of a semiconductor substrate irradiated with a laser beam, along with respective laser beam waveforms, according to Embodiment 1 of the present invention.
Figure 2B:
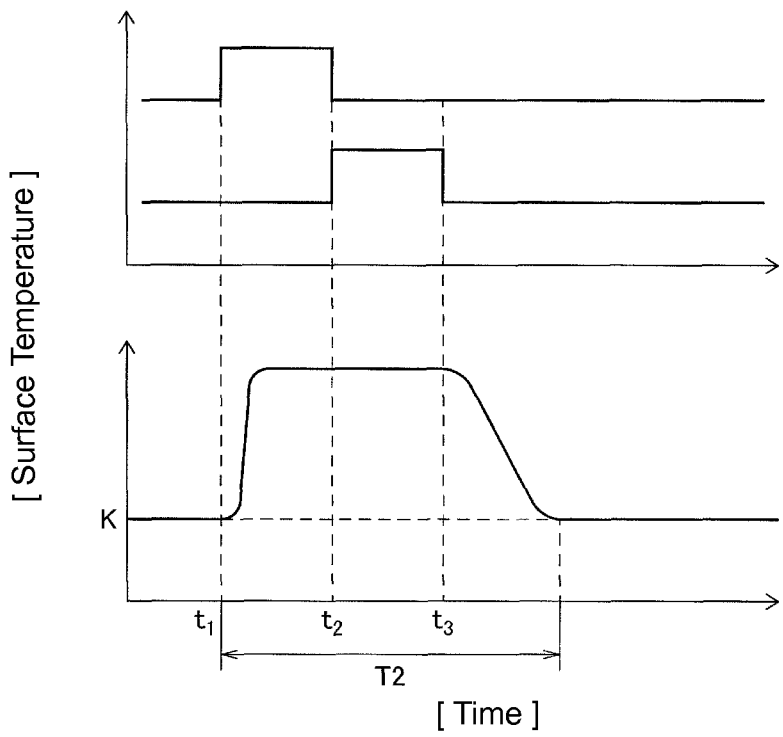

In the impurity introducing apparatus 1a illustrated in FIG. 1, the semiconductor substrate 2 and a solution vessel 5 are illustrated in cross-sectional view for descriptive purposes. The semiconductor substrate 2 is formed of SiC, and for example, 4H—SiC, which shows promise for use as a power semiconductor, is used. A 4H—SiC crystal layer is formed on the semiconductor substrate 2 by forming an epitaxial growth layer at a predetermined density. A (0001) surface ((000-1) surface) of the 4H—SiC is disposed on a surface of the semiconductor substrate 2 that is irradiated with the laser beam 32 (the top surface 2a, in the case of the semiconductor substrate 2 illustrated in FIG. 1).

The solution 4 is a solution in which an impurity element compound the semiconductor substrate 2 is to be doped with is dissolved. In the case where phosphorous (P) is used as the impurity element in the impurity introducing apparatus 1a illustrated in FIG. 1, a phosphoric solution having a concentration of 85 wt % can be used as the solution 4. Note that the impurity element is not limited to phosphorous, and another element such as boron (B), aluminum (Al), nitrogen (N), or the like may be used as appropriate. Furthermore, a variety of impurity element compounds can be used as appropriate as the solution 4, such as a boric acid aqueous solution when the impurity element is boron, an aluminum chloride aqueous solution when the impurity element is aluminum, an ammonia aqueous solution when the impurity element is nitrogen, or the like, for example.

A support platform 3 is mounted on an X-Y movement stage 8. The X-Y movement stage 8 supports the support platform 3 from below in a horizontal manner, is connected to a driving unit (not shown), and is configured to be capable of freely moving the semiconductor substrate 2 in each of directions within a horizontal plane (X-Y directions). A stepping motor, for example, may be used for driving primary movement in the X-Y directions, but for movement involved in positional control at the submicron level, friction may be eliminated using magnetic levitation. If, in addition to the primary movement, movement through frictionless magnetic driving is added, positional control of the X-Y movement stage 8 is possible at the nanometer level. The positional control may be carried out by feeding back an output from a laser interferometer, for example.

It is preferable that the support platform 3 be configured to be capable of moving in a Z direction that is perpendicular to the X-Y directions. For example, a Z movement stage that moves the support platform 3 in the Z direction is provided between the support platform 3 and the X-Y movement stage 8, as in the case of Embodiment 2, which will be described later. By configuring the support platform 3 to be capable of three-axis movement in the XYZ directions, the semiconductor substrate 2 can be freely moved to a predetermined position based on an irradiation target position of the laser beam 32, and a desired pattern for a region into which the impurity element is to be introduced can be drawn directly onto the semiconductor substrate 2.

The solution vessel 5 holds the solution 4 on the inside thereof and affixes and supports the semiconductor substrate 2 upon a base surface thereof. An amount of the solution 4 is held on the inside of the solution vessel 5 so that a level thereof is higher than a thickness of the semiconductor substrate 2 (a vertical direction length in FIG. 1), so that a solution layer, or in other words, the solution-present region A is formed on the top surface 2a of the semiconductor substrate 2. Meanwhile, the solution vessel 5 is affixed at a predetermined position on the support platform 3 so as not to shift from the support platform 3 even when the support platform 3 is moved by the X-Y movement stage 8.

A plurality of reference marks (not shown), for example, are formed on the base surface of the solution vessel 5. The reference marks are used as solution vessel 5-side irradiation target positions that correspond to irradiation target positions of the laser beam 32 set in advance on the semiconductor substrate 2. A solution circulating mechanism, including a pump (not shown), a pipe, a tank, and so on disposed on the outside of the solution vessel 5, is connected to the solution vessel 5, and circulates the solution 4 to be held inside the solution vessel 5. By circulating the solution 4, the solution-present region A is formed so as to maintain a constant impurity element concentration above the top surface 2a of the semiconductor substrate 2.

As illustrated in FIG. 1, the laser beam 32 is emitted by a laser optical system 30a. The laser optical system 30a includes a laser light source 31 that emits the laser beam 32, a variable slit (not shown) that shapes the emitted laser beam 32 into a predetermined shape, and a reflecting mirror (not shown) that reflects and conducts the shaped laser beam 32 to a focusing unit 37. The focusing unit 37 is a focusing lens, for example, and a border region between the semiconductor substrate 2 and the solution 4 is irradiated with the focused laser beam 32. In addition, an image capturing unit (not shown) such as a CCD camera or the like that captures an image of the reference marks in the solution vessel 5, an illumination light emitting unit (not shown) that emits illumination light, a mirror (not shown) that reflects and transmits the illumination light, an alignment mechanism (not shown), and so on may be additionally provided in the laser optical system 30a.

It is preferable that the laser optical system 30a be configured to emit the laser beam at a wavelength producing a greater energy than a band gap of the semiconductor substrate 2. A laser light source 31 that emits a laser beam in an ultraviolet range, such as a KrF (=248 nm) laser, an ArF (=193 nm) laser, or the like may be used, for example. The impurity element can be moved to interstitial positions of the 4H—SiC with ease by exciting the impurity element with optical energy in the ultraviolet range.

Next, descriptions will be given of an impurity introducing method using the impurity introducing apparatus 1a and irradiation operations of the laser beam 32 in the impurity introducing method according to Embodiment 1 of the present invention. First, as illustrated in FIG. 1, the semiconductor substrate 2 is placed on and affixed to the base surface of the solution vessel 5 on the inside thereof, with the top surface 2a facing away from the support platform 3. Next, the laser optical system 30a is moved by a predetermined amount in the X and Y directions so that positions of the reference marks indicating the irradiation target region on the semiconductor substrate 2 that is to be doped with the impurity element match an optical axis of the laser beam 32. At this time, the support platform 3 may be moved by a predetermined amount in the X and Y directions instead of moving the laser optical system 30a.

Next, the solution 4 is supplied to and held inside the solution vessel 5, the semiconductor substrate 2 is immersed in the solution 4 being held, and at the same time, the solution 4 is circulated using the solution circulating mechanism. By supplying the solution 4, the solution-present region A, which is a layer of the solution 4, is formed above the top surface 2a of the semiconductor substrate 2. Next, the irradiation position P on the top surface 2a of the semiconductor substrate 2 is irradiated with the laser beam 32. The irradiation target region below the irradiation position P becomes an irradiated region doped with the impurity element as a result of the irradiation position P being irradiated with the laser beam 32.

Here, in the impurity introducing method according to Embodiment 1, the waveform of the laser beam 32 is set and the laser beam 32 is emitted so that a temperature of the top surface 2a of the semiconductor substrate 2 at the irradiation position P of the laser beam 32 does not return to room temperature, the temperature of the top surface 2a of the semiconductor substrate 2 at the irradiation position P is raised, and the raised temperature is held for a predetermined amount of time. For example, there is a method of setting the laser beam 32 to a continuous wave, a method of joining a plurality of pulse waves repeatedly emitted so as to form an overall continuous waveform, and so on.

A change over time in the surface temperature of the semiconductor substrate 2 at the irradiation position P measured in the case where the laser beam 32 is emitted as a continuous wave is indicated in the lower section of FIG. 2A, and a waveform of the laser beam 32 is indicated in the upper section of FIG. 2A. Meanwhile, a change over time in the surface temperature of the semiconductor substrate 2 at the irradiation position P in the case where two pulse waves are joined and emitted as an overall continuous waveform is indicated in the lower section of FIG. 2B, and a waveform of the laser beam 32 is indicated in the upper section of FIG. 2B. As shown in FIGS. 2A and 2B, the changes over time in the waveforms of the respective laser beams 32 and the changes over time in the surface temperature of the semiconductor substrate 2 at the irradiation position P are indicated as overlapping in the vertical direction at the same times. The laser beam 32 irradiations indicated in FIG. 2A and FIG. 2B were carried out on the surface of the semiconductor substrate 2 having an n-epitaxial layer with a resistivity of 0.5 Ωcm formed on an n layer with a resistivity of 0.017 Ωcm. A KrF excimer laser (=248 nm) was used for the laser beam 32.

As illustrated in FIG. 2A, in the case where the laser beam 32 is a continuous wave, the laser beam 32 was emitted continuously at a constant output from when the irradiation was started at time t1 to when the irradiation ended at time t3.

Meanwhile, in the case where the laser beam 32 is a continuous waveform formed by joining two pulse waves, the two pulse waves were formed using a laser optical system 30a in which the laser light source 31 has two oscillators and pulses are emitted from the respective oscillators. The two pulse waves were formed using a laser beam 32 for a first pulse wave waveform, indicated on the upper side of the upper section in FIG. 2B, and a laser beam 32 for a second pulse wave waveform, indicated on the lower side of the upper section in FIG. 2B.

As illustrated in FIG. 2B, the second pulse wave is formed so that irradiation starts after a delay time equivalent to a length of a pulsewidth of the first pulse wave. In other words, there is no interval between the first pulse wave and the second pulse wave. The pulsewidth and pulse interval can both be set to 50 ns, for example. As illustrated in FIG. 2B, the first pulse wave started the irradiation from time t1 and then ended the irradiation at time t2. Meanwhile, the second pulse wave started the irradiation at time t2, when the irradiation of the first pulse wave ended, and ended the irradiation at time t3. By joining the first pulse wave and the second pulse wave at time t2, the irradiation position P of the semiconductor substrate 2 was irradiated with the laser beam 32 having what appears to be a continuous wave.

As illustrated in FIG. 2A, in the case where the laser beam 32 is a continuous wave, the surface temperature of the semiconductor substrate 2 at the irradiation position P of the semiconductor substrate 2, which was the room temperature K before the irradiation, reached a peak temperature after rising from time t1 at which the irradiation was started, and is held at the peak temperature until time t3 at which the irradiation ended. When the irradiation with the laser beam 32 ended, the surface temperature of the semiconductor substrate 2 at the irradiation position P dropped comparatively slowly and returned to the room temperature K. In other words, the laser beam 32 illustrated in FIG. 2A is emitted so that the temperature at the irradiation position P that has risen takes on a constant peak temperature without returning to the room temperature K. Note that a time for which the surface temperature of the semiconductor substrate 2 at the irradiation position P does not return to the room temperature K after first rising from the room temperature K is taken as a room temperature exceeding time T1.

As illustrated in FIG. 2B, in the case where the laser beam 32 is a continuous waveform formed by joining two pulse waves, the surface temperature of the semiconductor substrate 2 at the irradiation position P, which was the room temperature K before the irradiation, reached the peak temperature after rising from time t1 at which the irradiation of the first pulse wave started. The surface temperature at the irradiation position P that reached the peak temperature due to the irradiation of the first pulse wave was held until time t3 at which the irradiation of the second pulse wave ended. When the irradiation of the second pulse wave ended, the surface temperature of the semiconductor substrate 2 at the irradiation position P dropped comparatively slowly and returned to the room temperature K.

In other words, the laser beam 32 illustrated in FIG. 2B has a repeating pulse wave so that the temperature at the irradiation position P that has risen does not return to the room temperature K, and is emitted so that the temperature at the irradiation position P becomes a constant peak temperature. Note that a time for which the surface temperature of the semiconductor substrate 2 at the irradiation position P does not return to the room temperature K after first rising from the room temperature K is taken as a room temperature exceeding time T2, in the same manner as the case where the laser beam 32 is a continuous wave. As illustrated in FIGS. 2A and 2B, the room temperature exceeding time T1 in the case of a continuous wave and the room temperature exceeding time T2 in the case where two pulse waves are joined to form a continuous waveform were approximately the same.

Figure 3:
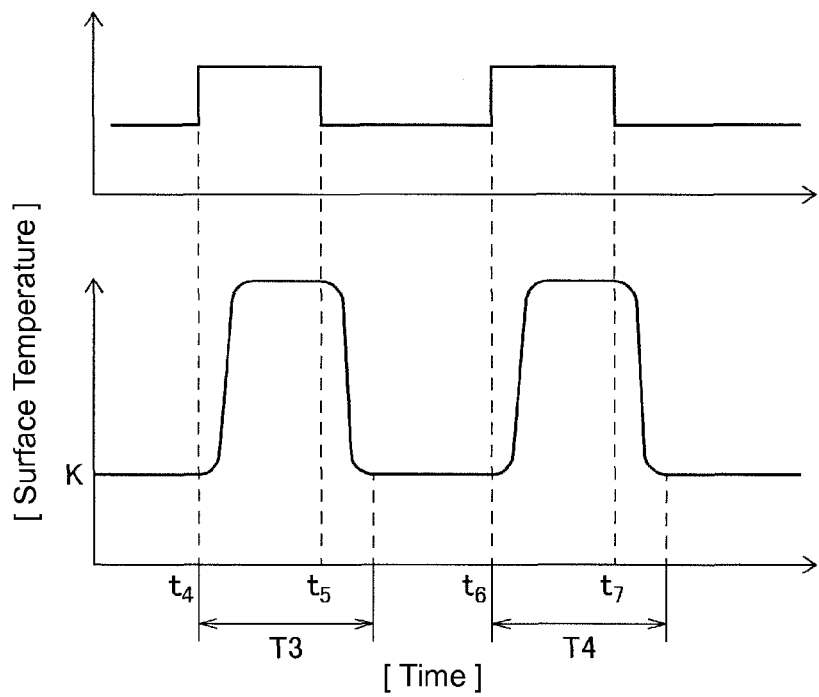
FIG. 3 is a diagram illustrating changes over time in a surface temperature of a position of a semiconductor substrate irradiated with a laser beam, along with a laser beam waveform, according to a comparison example.

Next, changes in the surface temperature of the semiconductor substrate 2 at the irradiation position P according to a comparison example, which discusses a case where the temperature of the semiconductor substrate 2 at the irradiation position P that has risen returns to room temperature between pulse waves, will be described with reference to FIG. 3. In the comparison example, the irradiation position P was irradiated with 100 shots of a laser beam 32 having a 50 nS pulsewidth at a pulse interval of 55 ns, as one example. The upper section of FIG. 3 illustrates pulse wave waveforms of a given two shots among the 100 shots. As illustrated in FIG. 3, the leading pulse wave of these two pulse waves started the irradiation from time t4 and then ended the irradiation at time t5. Meanwhile, the following pulse wave started the irradiation at time t6, when the irradiation of the leading pulse wave ended, and ended the irradiation at time t7.

Meanwhile, the lower section of FIG. 3 illustrates changes in the surface temperature of the semiconductor substrate 2 at the irradiation position P before and after the two pulse wave shots. In the comparison example, the surface of the semiconductor substrate 2 having an n-epitaxial layer with a resistivity of 0.5 Ωcm formed on an n layer with a resistivity of 0.017 Ωcm was irradiated with the laser beam 32 of a KrF excimer laser (=248 nm), as in the case illustrated in FIGS. 2A and 2B. An energy density of a single shot on the irradiated region was 3.7-4.3 J/cm$^2$.

In the case where the laser beam 32 is emitted using the pulse waves according to the comparison example, the surface temperature of the semiconductor substrate 2 at the irradiation position P, which was the room temperature K before irradiation, reached the peak temperature after rising from time t4 at which the irradiation of the leading pulse wave started. However, the surface temperature of the semiconductor substrate 2 quickly returned to the room temperature K after time t5 at which the irradiation of the leading pulse wave ended. At this time, the following pulse wave has not yet started irradiation. The surface temperature of the semiconductor substrate 2 at the irradiation position P then rose again from time t6 at which the irradiation of the following pulse wave starts, reached the peak temperature, and quickly returned to the room temperature K after time t7 at which the irradiation ended. A room temperature exceeding time T3 for the surface temperature at the irradiation position P during the irradiation of the leading pulse wave and a room temperature exceeding time T4 for the surface temperature at the irradiation position P during the irradiation of the following pulse wave were approximately the same. The room temperature exceeding times T3 and T4 for the surface temperature at the irradiation position P during irradiation with the laser beam 32 according to the comparison example were both shorter than the respective room temperature exceeding times T1 and T2 during irradiation with the laser beam 32 according to Embodiment 1 as illustrated in FIGS. 2A and 2B.

Figure 4:
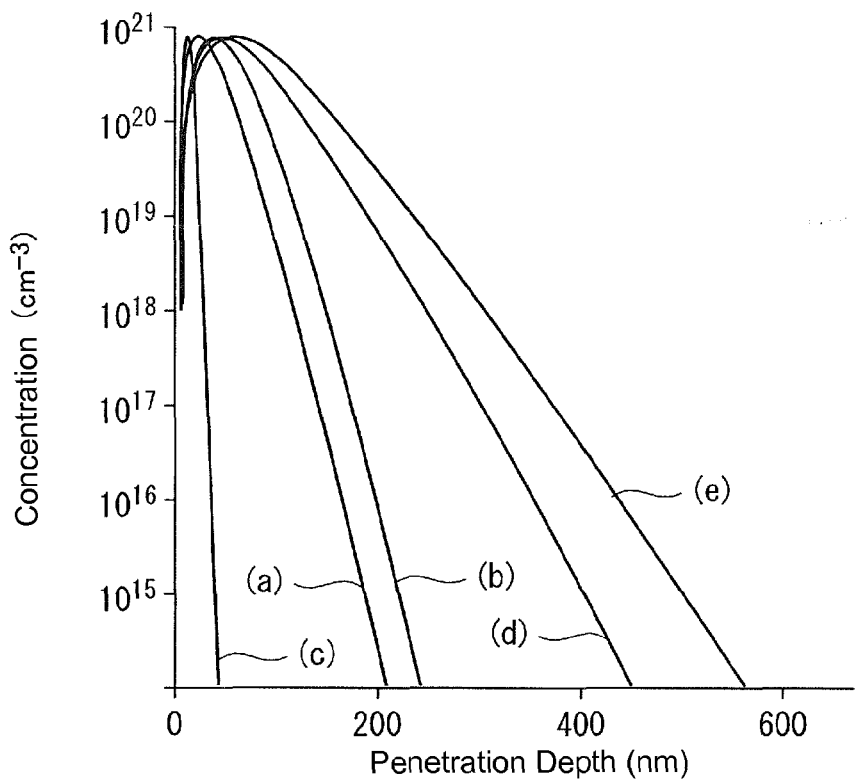
FIG. 4 is a diagram illustrating a penetration depth of an impurity element at a position irradiated with a laser beam, analyzed using secondary ion mass spectroscopy (SIMS).

As indicated by a curve (c) in FIG. 4, in the comparison example, a penetration depth of the impurity element stopped at approximately 40 nm even after the irradiation position P was irradiated with 100 shots of the laser beam 32. However, as indicated by a curve (a) in FIG. 4, in the working example of Embodiment 1, the impurity element was successfully introduced to a depth of 200 nm or more from the top surface 2a of the semiconductor substrate 2 in the case where the continuous wave indicated in the upper section of FIG. 2A was emitted. Furthermore, as indicated by a curve (b) in FIG. 4, in the case where the continuous waveform formed by joining two pulse waves indicated in the upper section of FIG. 2B was emitted, the impurity element penetrated even more deeply than when using a continuous wave. Reasons for the results indicated in FIG. 4 will be explained hereinafter.

In the case of the comparison example, the surface temperature of the semiconductor substrate 2 at the irradiation position P falls from the peak temperature to the room temperature K each time the irradiation of a single pulse ends. Accordingly, a span of time in which the temperature does not return to the room temperature K is formed intermittently with each pulse while the same irradiation position P is being irradiated with the laser beam 32 emitted as a plurality of pulses. In other words, the room temperature exceeding times T3 and T4 are comparatively short and are formed in small intervals. Accordingly, an amount of energy sufficient to raise the surface temperature of the semiconductor substrate 2 at the irradiation position P from the room temperature K is necessary in each pulse emitted, and the energy of the laser beam 32 that can be supplied to the irradiation position P is wasted by that amount.

For example, even if 100 shots of a pulse-form laser beam are emitted, a large amount of energy for the laser beam 32 is consumed with each shot, and thus much of the energy of the 100 shots of the laser beam 32 will not be fully absorbed by the SiC semiconductor substrate 2. Accordingly, the absorption of energy stops at a shallow area of the semiconductor substrate 2, and the impurity element only penetrates to a shallow position.

On the other hand, in the impurity introducing method according to Embodiment 1, the waveform of the laser beam 32 is set so that the surface temperature of the semiconductor substrate 2 at the irradiation position P does not return to the room temperature K after rising. As a result, the surface temperature of the semiconductor substrate 2 that first rises due to heating is held at that temperature for a long period of time, which makes it possible for all of the energy of the laser beam 32 on the irradiation position P to be effective absorbed by the SiC semiconductor substrate 2. Accordingly, the depth to which the impurity element penetrates into the semiconductor substrate 2 can be maximized.

It should be noted that in the case where the irradiation position P of the semiconductor substrate 2 is irradiated with the laser beam 32 formed by joining a plurality of pulse waves, the number of pulse waves is not limited to the two pulse waves indicated in FIG. 2B. The pulsewidth and pulse interval are also not limited to the aforementioned values. The pulsewidth and pulse interval may be set as desired as long as the temperature at the irradiation position P that has risen remains greater than or equal to a pre-set temperature (the room temperature K, in the case of Embodiment 1) until the laser beam 32 irradiation of a single irradiation position P on the semiconductor substrate 2 ends. However, in terms of energy being efficiently absorbed by the semiconductor substrate 2, it is preferable that the pulse interval at least be less than or equal to 50 ns.

Descriptions of the impurity introducing method according to Embodiment 1 will continue hereinafter. After a given irradiation position P has been irradiated with the laser beam 32, the irradiation target region is moved to one side in the X direction, as indicated by the left-facing arrow in the upper area of FIG. 5, for example. This movement may be carried out by moving the laser optical system 30a in a desired direction, or may be carried out by moving the support platform 3 in a direction opposite from the desired direction so as to move the irradiation target region relative to the laser optical system 30a.

Figure 5:
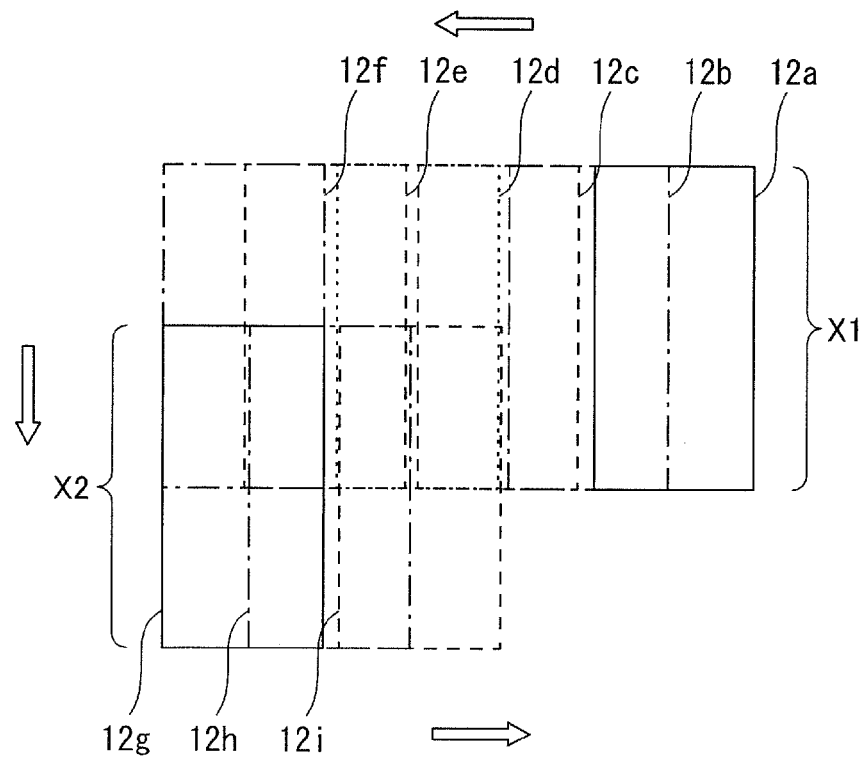
FIG. 5 is a diagram illustrating an impurity element doping region formed using an impurity introducing method according to Embodiment 1 of the present invention when planarly viewing a semiconductor substrate.

After the irradiation target region has been moved, an irradiation target region adjacent to an irradiated region 12a into which the impurity element has been introduced is irradiated with the laser beam 32, and irradiated regions 12b, 12c, 12d, and so on are consecutively formed on the top surface 2a of the semiconductor substrate 2 as a result, as illustrated in FIG. 5. The plurality of irradiated regions 12a, 12b, 12c, 12d, and so on formed in this manner form an irradiation line X1 that is a region extending in the X direction in FIG. 5. The irradiation line X1 is formed so that mutually-adjacent irradiated regions overlap by approximately half a single unit of movement in the X direction.

After a final irradiated region 12f of the irradiation line X1 is formed, the laser optical system 30a or the support platform 3 is moved by a predetermined amount in the Y direction. The movement in the Y direction indicated in FIG. 5 is carried out by moving from the final irradiated region 12f of the irradiation line X1 to an initial irradiated region 12g of an irradiation line X2 that follows the irradiation line X1, as indicated by the downward-facing arrow on the left side of FIG. 5. The final irradiated region 12f of the previous irradiation line X1 and the initial irradiated region 12g of the following irradiation line are formed so as to overlap by approximately half the unit of movement in the Y direction.

Next, the irradiation target region is moved in the X direction, parallel to the previous irradiation line X1, as indicated by a right-facing arrow in the bottom area of FIG. 5. In other words, as indicated in FIG. 5, a scan is carried out and a pattern in which a plurality of irradiated regions are overlapped is formed on the top surface 2a of the semiconductor substrate 2. By introducing the impurity element into each irradiated region as indicated in FIGS. 2A and 2B, a pattern for adding the impurity element to part of the interior of the semiconductor substrate 2 can be drawn directly and an impurity element-doped surface can be formed.

Next, a method of manufacturing a semiconductor element using the impurity introducing method according to Embodiment 1 will be described with reference to FIG. 6-FIG. 10, using the manufacture of a MOSFET as an example. Note, however, that the impurity introducing method according to Embodiment 1 is not limited to MOSFETs, and can also be applied in the manufacture of other semiconductor elements such as FWDs, IGBTs, and the like.

The method of manufacturing a semiconductor element according to Embodiment 1 forms a first semiconductor region of a first conductivity type on the surface of the semiconductor substrate 2. The method of manufacturing a semiconductor element according to Embodiment 1 includes forming the solution-present region A in which the solution 4 is present by bringing the solution 4, which contains an impurity element compound of the first conductivity type, into contact with a surface of the semiconductor substrate 2, which is the first conductivity type or a second conductivity type, at room temperature. Here, the first conductivity type is n-type or p-type. If the first conductivity type is n-type, the second conductivity type is p-type, and if the first conductivity type is p-type, the second conductivity type is n-type.

In addition, the method of manufacturing a semiconductor element according to Embodiment 1 includes irradiating the semiconductor substrate 2 with the laser beam 32 through the solution 4 so that the temperature at the irradiation position P that has risen does not return to room temperature until all irradiation of the irradiation position P by the laser beam 32 has ended. The method also includes forming a second semiconductor region of the first conductivity type in the first semiconductor region at a higher concentration than the semiconductor region by bringing the semiconductor substrate 2 into contact with the solution 4 containing a compound of the first conductivity type impurity element and irradiating the semiconductor substrate 2 with the laser beam 32. The high-concentration first conductivity type second semiconductor region may be used as various types of regions in the semiconductor element, and in Embodiment 1, is formed as a contact region.

The method of manufacturing a semiconductor element according to Embodiment 1 also includes forming an ohmic electrode layer in the contact region. The method also includes forming a second semiconductor region of the second conductivity type on a surface of the first semiconductor region of the first conductivity type by bringing the semiconductor substrate 2 into contact with the solution 4 containing a compound of a second conductivity type impurity element and irradiating the semiconductor substrate 2 with the laser beam 32.

Figure 6:
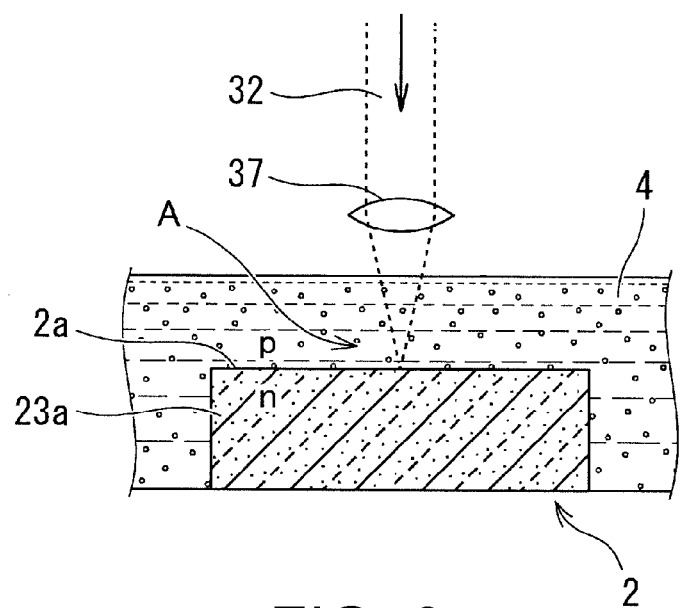
FIG. 6 is a cross-sectional view illustrating a method of manufacturing a semiconductor element using an impurity introducing method according to Embodiment 1 of the present invention.
Figure 7:
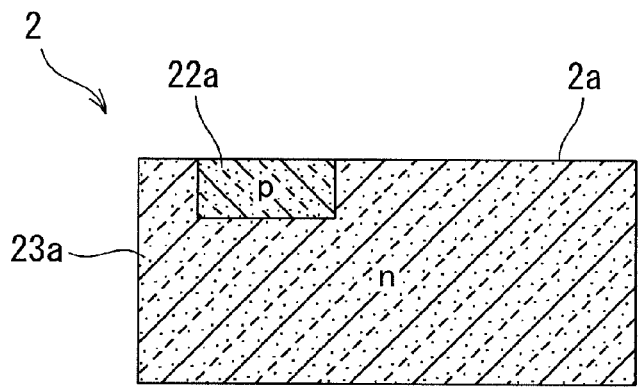
FIG. 7 is a cross-sectional view illustrating a method of manufacturing a semiconductor element using an impurity introducing method according to Embodiment 1 of the present invention.

In the method of manufacturing a semiconductor element according to Embodiment 1, first, as illustrated in FIG. 6, the solution-present region A, in which the solution 4 containing the second conductivity type impurity element is present, is formed above the top surface 2a of a third semiconductor region 23a. Next, the third semiconductor region 23a is irradiated through the solution 4 with the laser beam 32 focused by the focusing unit 37. As a result of the irradiation with the laser beam 32, a second conductivity type second semiconductor region 22a is formed in part of an upper area of the third semiconductor region 23a so as to expose the top surface 2a of the semiconductor substrate 2, as illustrated in FIG. 7.

Figure 8:
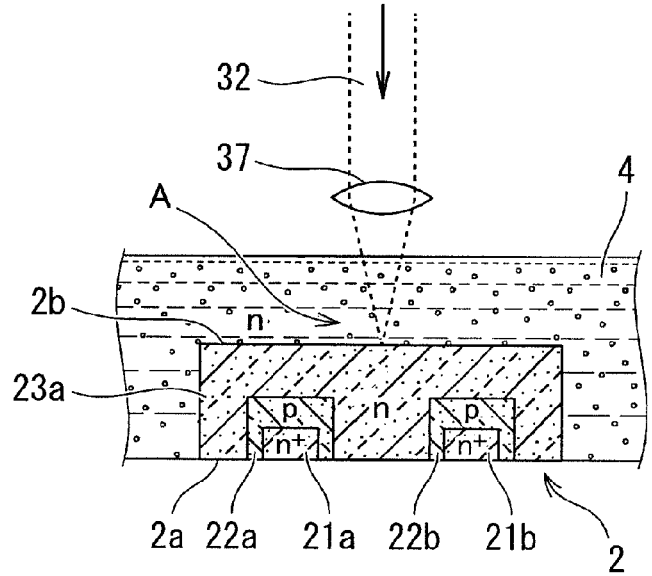
FIG. 8 is a cross-sectional view illustrating a method of manufacturing a semiconductor element using an impurity introducing method according to Embodiment 1 of the present invention.

Next, the type of the solution 4 is changed to a solution 4 containing a first conductivity type impurity element. Then, the second semiconductor region 22a is irradiated with the laser beam 32 through the solution 4 and a first conductivity type first semiconductor region 21a is formed in part of an upper area of the second semiconductor region 22a, in the same manner as illustrated in FIG. 6. FIG. 8 illustrates an example of two second semiconductor regions 22a and 22b, and two first semiconductor regions 21a and 21b respectively formed within the second semiconductor regions 22a and 22b, formed by repeating the processes illustrated in FIG. 6 and FIG. 7.

Figure 9:
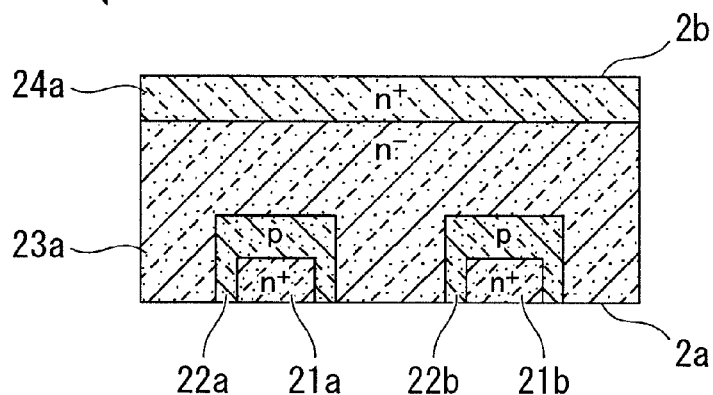
FIG. 9 is a cross-sectional view illustrating a method of manufacturing a semiconductor element using an impurity introducing method according to Embodiment 1 of the present invention.

Next, the semiconductor substrate 2 is flipped so as to be inverted vertically and is then re-immersed in the solution vessel 5, and the solution-present region A, in which the solution 4 containing the first conductivity type impurity element is present, is formed on a bottom surface 2b, which corresponds to a rear surface of the semiconductor substrate 2. Then, the third semiconductor region 23a is irradiated with the laser beam 32 through the solution 4, and a first conductivity type fourth semiconductor region 24a, serving as a contact region, is formed in the third semiconductor region 23a on the side opposite from the second semiconductor region 22a, as illustrated in FIG. 9. The fourth semiconductor region 24a is a higher-concentration region than the third semiconductor region 23a.

Figure 10:
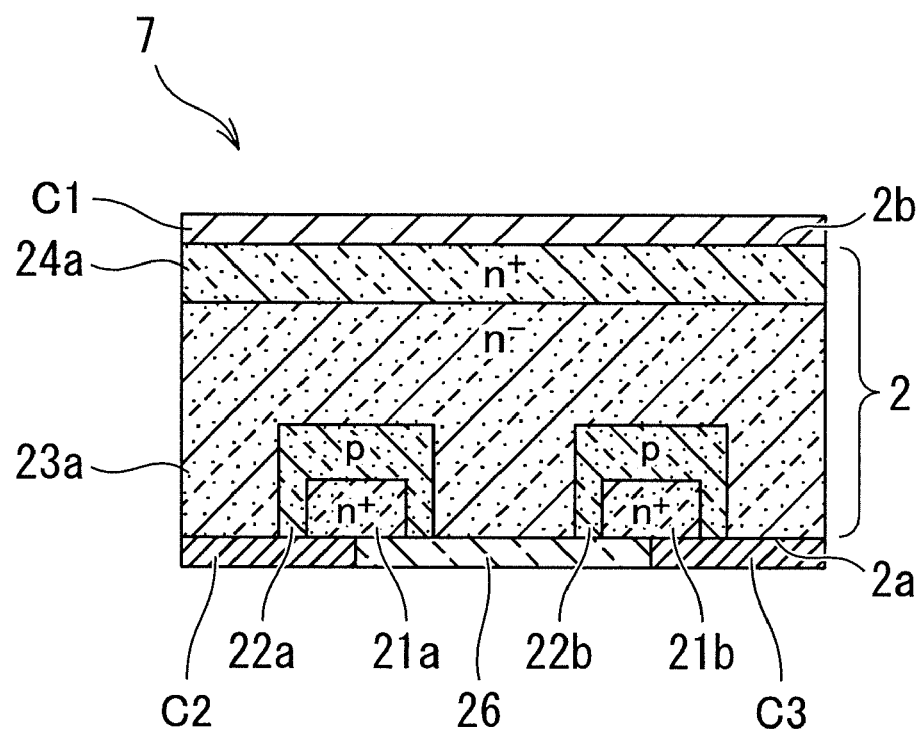
FIG. 10 is a cross-sectional view illustrating a method of manufacturing a semiconductor element using an impurity introducing method according to Embodiment 1 of the present invention.

Next, as illustrated in FIG. 10, a drain electrode is formed by joining a first ohmic electrode layer C1 to the fourth semiconductor region 24a on the bottom surface 2b of the semiconductor substrate 2. Meanwhile, a source electrode is formed by joining a second ohmic electrode layer C2, a third ohmic electrode layer C3, and an oxide film 26 to the top surface 2a of the semiconductor substrate 2. A gate electrode is formed by joining an electrode layer (not shown) to the oxide film 26. A semiconductor element 7 that functions as a MOSFET is manufactured by repeating the processes illustrated in FIG. 6-FIG. 10 as appropriate.

Note that in the case where the third semiconductor region 23a according to Embodiment 1 serves as a second semiconductor region according to one aspect of the present invention, the fourth semiconductor region 24a according to Embodiment 1 corresponds to a first semiconductor region according to one aspect of the present invention.

As described thus far, with the impurity introducing method according to Embodiment 1, the waveform of the laser beam 32 is set so that the temperature of a single irradiation position P irradiated with the laser beam 32 does not return to room temperature after the temperature has risen due to heating until all laser beam irradiation of that same irradiation position P has ended. As such, with the impurity introducing method according to Embodiment 1, in the case of laser doping using the impurity element contained in the solution 4, the efficiency with which the semiconductor substrate 2 absorbs the energy of the laser beam 32 can be improved and the impurity element can be caused to penetrate to a greater depth.

Meanwhile, with the method of manufacturing a semiconductor element according to Embodiment 1, the impurity element can be caused to penetrate more deeply into the rear surface of a semiconductor element formed using the SiC semiconductor substrate 2, making it easier to increase the concentration of an impurity element implant layer across the entire rear surface, which in turn makes it possible to obtain a semiconductor element having improved contact properties with a metal electrode layer joined to the rear surface.

An impurity introducing apparatus according to Embodiment 2 of the present invention will be described next. Note that areas that are the same as in the impurity introducing apparatus 1a according to Embodiment 1 will not be described in detail, and the following descriptions will focus on the differences therefrom. Note also that in impurity introducing apparatuses 1b and 1c illustrated in FIG. 11 to FIG. 13, a semiconductor substrate 2 and a solution vessel 5 are illustrated in cross-sectional view for descriptive purposes.

Figure 11:
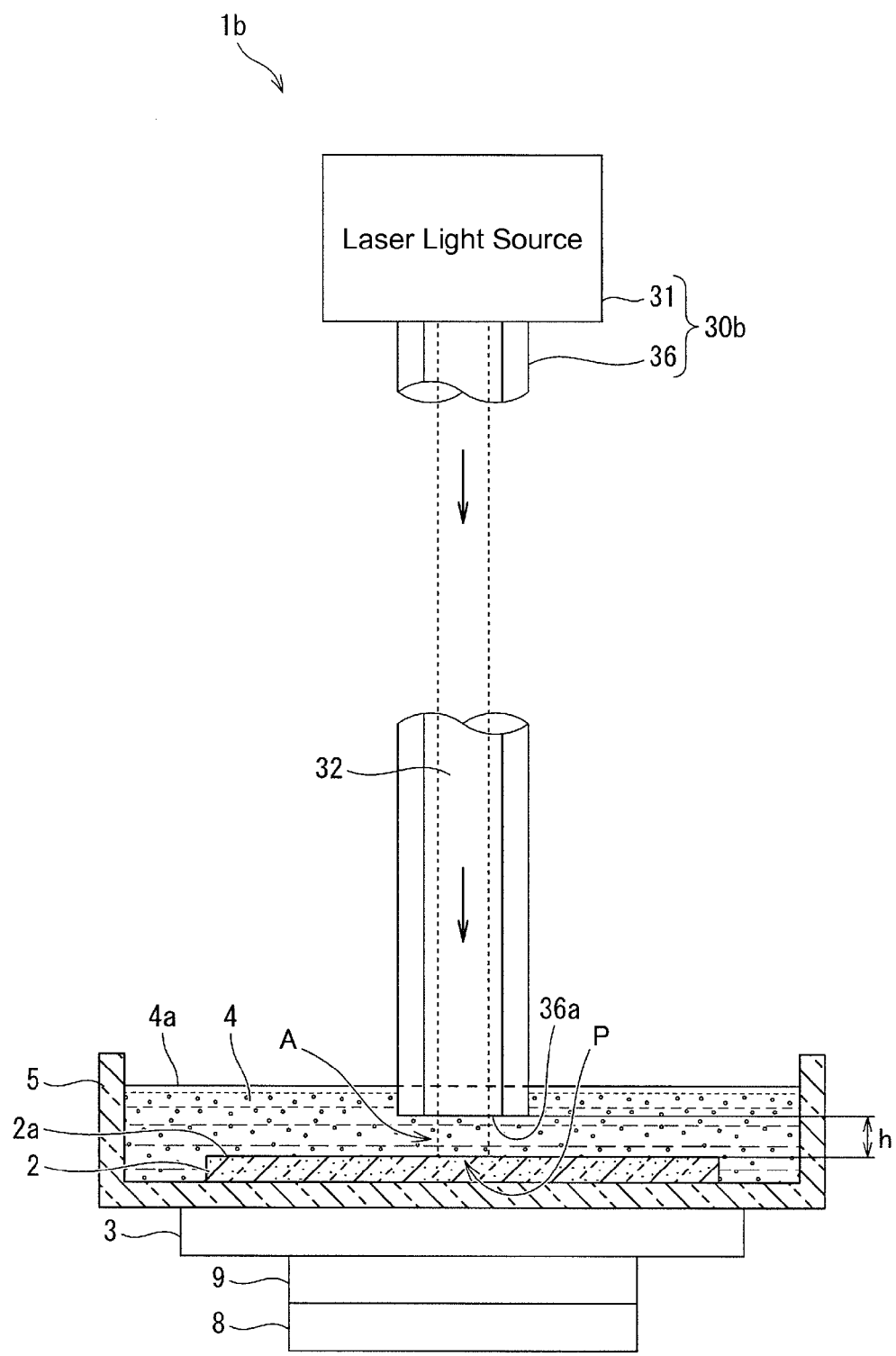
FIG. 11 is a partial cross-sectional view schematically illustrating, from the side, an impurity introducing apparatus according to Embodiment 2 of the present invention.

As illustrated in FIG. 11, the impurity introducing apparatus 1b according to Embodiment 2 includes the solution vessel 5, which holds, at room temperature, a solution 4 containing an impurity element on the inside thereof and affixes a semiconductor substrate 2 upon a base surface thereof that has a concave shape; the solution 4 is brought into contact with a top surface 2a of the semiconductor substrate 2 (a surface on the side opposite from the base surface of the solution vessel 5) so as to form a solution-present region A in which the solution 4 is present. The impurity introducing apparatus 1b furthermore includes a support platform 3 that supports the semiconductor substrate 2 via the solution vessel 5 and a laser optical system 30b having an optical fiber 36 whose one end surface 36a, which forms an emission-side end surface, is disposed within the solution 4.

The laser optical system 30b inputs a laser beam 32 into the optical fiber 36 and irradiates an irradiation position P on the top surface 2a of the semiconductor substrate 2 with the laser beam 32 from the emission-side end surface 36a through the solution 4 present between the emission-side end surface 36a and the semiconductor substrate 2. Like the impurity introducing apparatus 1a according to Embodiment 1, the impurity introducing apparatus 1b introduces the impurity element into part of the interior of the semiconductor substrate 2 by emitting the laser beam 32 whose waveform has been set so that a temperature of the irradiation position P that has risen does not return to room temperature.

Meanwhile, the impurity introducing apparatus 1b according to Embodiment 2 includes an X-Y movement stage 8 that freely moves the support platform 3 in X-Y directions defined within a plane parallel to a primary surface of the semiconductor substrate 2. The impurity introducing apparatus 1b further includes a Z movement stage 9 that freely moves the support platform 3 in a Z direction perpendicular to the X-Y directions.

The laser optical system 30b includes a laser light source 31 and the optical fiber 36, which conducts the laser beam 32 emitted from the laser light source 31 toward the semiconductor substrate 2. The laser optical system 30b is provided with a connector (not shown) that connects the laser light source 31 and the optical fiber 36, a support unit (not shown) that supports the optical fiber 36, and so on. The laser optical system 30b emits the laser beam 32 at a wavelength producing a greater energy than a band gap of the semiconductor substrate 2.

As illustrated in FIG. 11, the emission-side end surface 36a of the optical fiber 36 is disposed within the solution 4 so as to be parallel to the top surface 2a of the semiconductor substrate 2 and so that a height h is formed between the emission-side end surface 36a and the top surface 2a. In other words, the end surface 36a of the optical fiber 36 is positioned below a liquid surface 4a of the solution 4, and the laser beam 32 is emitted toward the top surface 2a of the semiconductor substrate 2 from within the solution 4.

The height h between the emission-side end surface 36a of the optical fiber 36 and the top surface 2a of the semiconductor substrate 2 is set so that a relative distance between the optical fiber 36 and the semiconductor substrate 2 is controlled by the Z movement stage 9. Here, it is preferable that the height h be set to no less than 0.05 mm and no greater than 10.00 mm. A lower limit value of the height h is no less than 0.05 mm in order to ensure a desired penetration depth for the impurity element while also preventing the laser beam 32 from going out of focus. On the other hand, an upper limit value of the height h is no greater than 10.00 mm because a sufficient penetration depth for the impurity element cannot be ensured in the case where the height h exceeds 10.00 mm. It is preferable that the upper limit value of the height h be no greater than 3.00 mm in order to further suppress the laser beam 32 from reflecting in the solution 4, and it is further preferable that the upper limit value be no greater than 1.0 mm.

Figure 12:
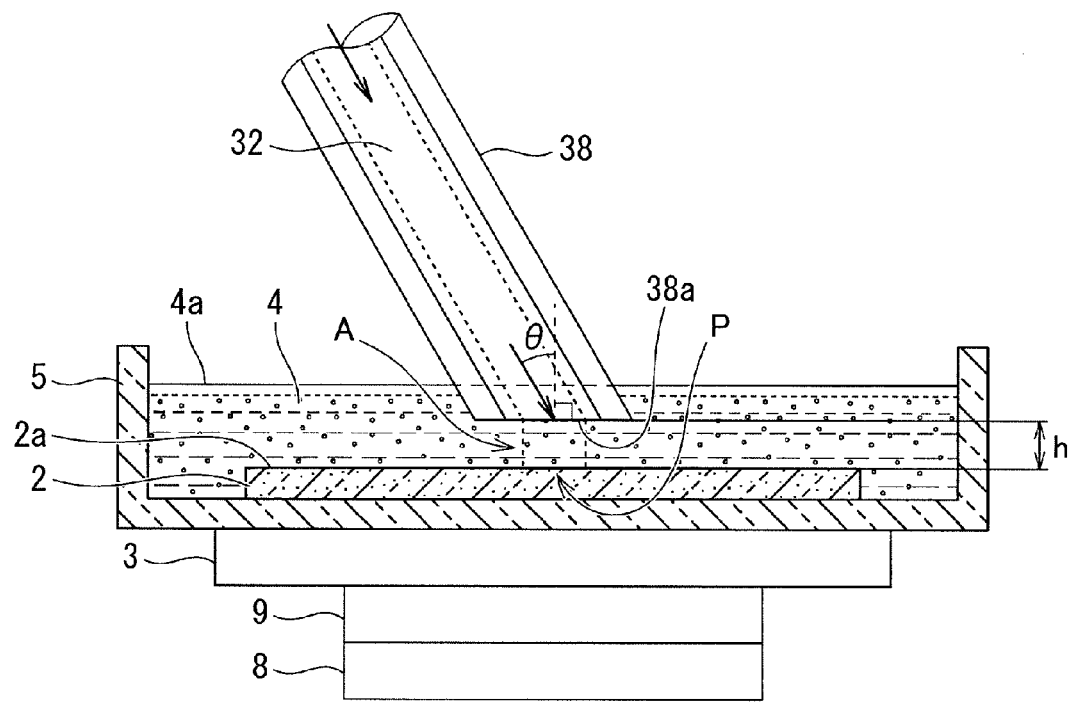
FIG. 12 is a partial cross-sectional view schematically illustrating, from the side, part of another example of an impurity introducing apparatus according to Embodiment 2 of the present invention.

Note that in the impurity introducing apparatus 1b according to Embodiment 2, the irradiation position P may be irradiated with the laser beam 32 having disposed an optical fiber 38 so that an optical axis of the laser beam 32 is slanted relative to a line perpendicular to the liquid surface 4a of the solution 4, as illustrated in FIG. 12. In FIG. 12, the liquid surface 4a of the solution 4 is indicated as identical to a shape of an emission-side end surface 38a of the optical fiber 38.

The laser beam 32 is configured to be incident on the liquid surface 4a at a pre-set angle of incidence $\theta$. In the case where the laser beam 32 is deflected so that an oscillating direction of an electric field vector is parallel to a plane of incidence, the angle of incidence $\theta$ is to set to a Brewster angle. In other words, all incident light can be transmitted and the semiconductor substrate 2 irradiated therewith without the laser beam 32 being reflected at a border between the emission-side end surface 38a of the optical fiber 38 and the liquid surface 4a, and thus the energy of the laser beam 32 can be used effectively.

That is, in the impurity introducing apparatus 1b according to Embodiment 2, the emission-side end surface 36a of the optical fiber 36 opposes the semiconductor substrate 2 within the solution 4 at the irradiation position P on a region of the semiconductor substrate 2 into which the impurity element is to be introduced, and the laser beam 32 is emitted from within the solution 4. The laser beam 32 is not reflected within the solution 4 in a space between the liquid surface 4a of the solution 4 and the emission-side end surface 36a of the optical fiber 36. The impurity introducing apparatus 1b suppresses the laser beam 32 from reflecting within the solution 4, and the density of the energy supplied to the irradiation position P is increased by the optical fiber 36 focusing the laser beam 32, making it possible to use the laser beam 32 effectively.

Figure 13:
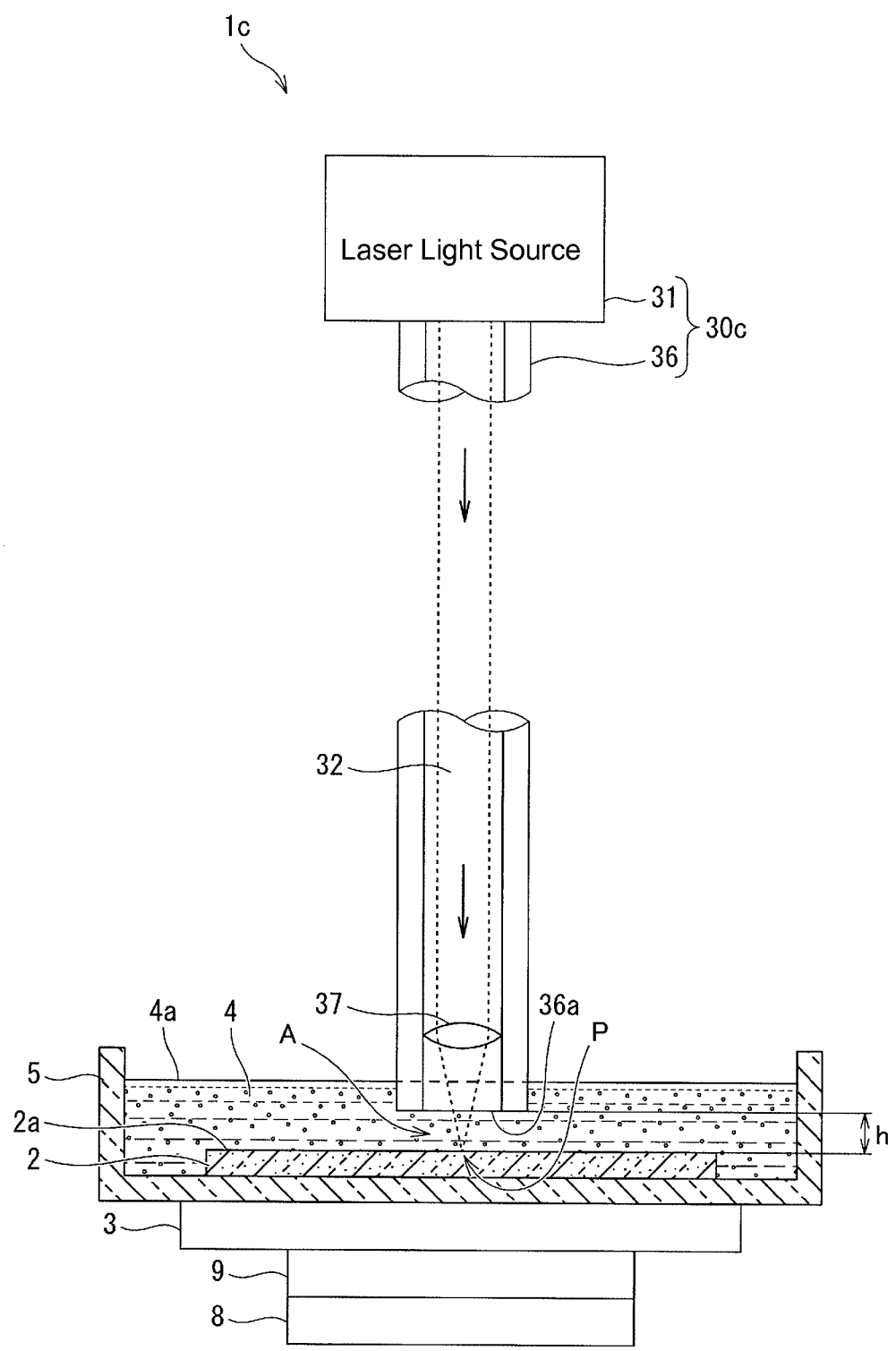
FIG. 13 is a partial cross-sectional view schematically illustrating, from the side, another example of an impurity introducing apparatus according to Embodiment 2 of the present invention.

FIG. 13 illustrates another example of the configuration of the impurity introducing apparatus 1b according to Embodiment 2. The impurity introducing apparatus 1c illustrated in FIG. 13 has the same basic configuration as the impurity introducing apparatus 1b illustrated in FIG. 11, but differs in terms of the configuration of a laser optical system 30c. The laser optical system 30c includes a laser light source 31, an optical fiber 36 that conducts a laser beam 32 emitted from the laser light source 31, and a focusing unit 37, within the optical fiber 36, that focuses the inputted laser beam 32 and irradiates a semiconductor substrate 2 with the focused laser beam 32.

The focusing unit 37 is constituted by the same type of focusing lens described in Embodiment 1, for example. By providing the focusing unit 37 within the optical fiber 36, the laser beam 32 is focused and then emitted, which makes it possible to increase the density of the energy supplied to the irradiation position P.

Operations of emitting the laser beam 32 using the impurity introducing apparatuses 1b and 1c according to Embodiment 2 will be described next. First, as illustrated in FIG. 11 and FIG. 13, the semiconductor substrate 2 is placed on and affixed to the base surface of the solution vessel 5 on the inside thereof, with the top surface 2a facing away from the support platform 3. Next, the laser optical system 30b is moved so that positions of the reference marks indicating the irradiation target region on the semiconductor substrate 2 that is to be doped with the impurity element match an optical axis of the laser beam 32, in the same manner as when using the impurity introducing apparatus 1a according to Embodiment 1. Alternatively, the support platform 3 is moved by a predetermined amount in the X and Y directions. By carrying out the subsequent processes in the same manner as in Embodiment 1, the impurity element can be caused to penetrate deeply into the semiconductor substrate 2 and a desired circuit pattern can be drawn directly thereon, and a semiconductor element can be manufactured as well.

(d) in FIG. 4 indicates an impurity element penetration depth in the case where the laser beam 32 is emitted as a continuous wave as indicated in FIG. 2A using the impurity introducing apparatus 1b illustrated in FIG. 11. Meanwhile, (e) in FIG. 4 indicates an impurity element penetration depth in the case where the laser beam 32 is emitted as a continuous wave formed by joining a plurality of pulse waves as indicated in FIG. 2B using the impurity introducing apparatus 1c illustrated in FIG. 13.

First, in a comparison example (c) in FIG. 4, the laser beam 32 is emitted from above the liquid surface 4a of the solution 4. It is easy for the laser beam 32 to reflect within the solution 4, and thus when the laser beam 32 enters the solution 4 from above the liquid surface 4a, the density of the energy supplied to the irradiation position P drops due to the large influence of scattering. Accordingly, the absorption of energy of the laser beam 32 into the SiC semiconductor substrate 2 does not extend to deep areas of the semiconductor substrate 2, and instead stops at shallow areas, resulting in a comparatively shallow impurity element penetration depth of approximately 40 nm.

On the other hand, with an impurity introducing method using the impurity introducing apparatuses 1b and 1c according to Embodiment 2, the emission-side end surface 36a of the optical fiber 36 is positioned within the solution 4, and the influence of scattering caused by the solution 4 can be reduced by an amount equivalent to the distance from the liquid surface 4a of the solution 4 to the end surface 36a. Accordingly, as indicated by (d) and (e) in FIG. 4, the absorption of energy of the laser beam 32 extends to deep areas of the semiconductor substrate 2, and thus the penetration depth can be increased to 400 nm or more, even in the SiC semiconductor substrate 2. Other effects of the impurity introducing apparatuses 1b and 1c according to Embodiment 2 are the same as the effects derived from the aforementioned Embodiment 1.

Although impurity introducing apparatuses, introducing methods, and methods of manufacturing a semiconductor element have been described based on embodiments of the present invention, it should be noted that the present invention is not intended to be limited to the aforementioned embodiments, and may be modified as appropriate without departing from the essential spirit of the invention. For example, the semiconductor substrate 2 may be placed directly upon the support platform 3, a member that surrounds the top surface 2a of the placed semiconductor substrate 2 so that the solution 4 is localized on the top surface 2a may be disposed so as to form a layer of the solution 4 on the semiconductor substrate 2, and the laser doping may then be carried out through the solution 4. In the case of laser doping using a localized solution 4, it is not necessary to immerse the entire semiconductor substrate 2 in the solution 4 as with the solution vessel 5 described in the aforementioned embodiments, and thus the amount of the solution 4 used in the laser doping can be reduced. Meanwhile, a XeCl excimer (308 nm), a XeF excimer (351 nm), a YAG laser third harmonic (355 nm), a YAG laser second harmonic (532 nm), or the like may be used as the laser. Furthermore, an optical waveguide formed from quartz or the like, for example, can be used as the optical fiber as long as there is little light loss.

It is sufficient for at least one aspect of the present invention to be configured so that a temperature of a single irradiated position on a surface of a semiconductor substrate that has risen due to heating does not return to a pre-set temperature until all laser beam irradiation of the irradiated position ends, and the configurations described in the respective embodiments may be combined as appropriate.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A method for introducing impurity into a semiconductor substrate, comprising:
    bringing a solution containing a compound of an impurity element into contact with a primary surface of a semiconductor substrate; and
    irradiating the primary surface of said semiconductor substrate with a laser beam through the solution to raise a temperature of the primary surface of said semiconductor substrate at a position irradiated by the laser beam so as to dope the impurity element into the semiconductor substrate,
    wherein said laser beam irradiation is performed such that said raised temperature does not return to room temperature until a prescribed dose of the impurity element is caused to be doped into the semiconductor substrate,
    wherein irradiating the semiconductor substrate with the laser beam includes:
        providing an optical fiber with one end face disposed within said solution, and irradiating the primary surface of said semiconductor substrate with the laser beam that is emitted from said one end face of the optical fiber, and
    wherein in the step of irradiating said semiconductor substrate with the laser beam, said one end face of the optical fiber is angled with respect to a longitudinal direction of an adjacent end portion of the optical fiber, such that an angle of incidence of the laser beam to said solution is a Brewster angle with respect to said solution.

2. The method according to claim 1, wherein said laser beam is a continuous wave.

3. The method according to claim 1, wherein a waveform of said laser beam is a continuous waveform formed by a plurality of pulse waves joining together.

4. The method according to claim 2, wherein irradiating the semiconductor substrate with the laser beam includes:
    moving said semiconductor substrate in an X-Y direction defined within a plane parallel to the primary surface of said semiconductor substrate during the laser irradiation so as to directly define a pattern on the primary surface of the semiconductor substrate in which said impurity element is introduced to said semiconductor substrate.

5. The method according to claim 3, wherein irradiating the semiconductor substrate with the laser beam includes:
    moving said semiconductor substrate in an X-Y direction defined within a plane parallel to the primary surface of said semiconductor substrate during the laser irradiation so as to directly define a pattern on the primary surface of the semiconductor substrate in which said impurity element is introduced to said semiconductor substrate.

6. The method according to claim 1,
wherein the impurity element in the solution is a first conductivity type, and
wherein the primary surface of the semiconductor substrate into which the impurity element is doped is one of the first conductivity type or a second conductivity type so that the laser beam irradiation of the semiconductor substrate with the laser beam forms a first semiconductor region of the first conductivity type in the primary surface of said semiconductor substrate.

7. The method according to claim 6, further comprising:
forming a second semiconductor region of the second conductivity type in a surface of said first semiconductor region of said first conductivity type in the primary surface of said semiconductor substrate by bringing said semiconductor substrate into contact with a solution containing a compound of a second conductivity type impurity element and by irradiating said semiconductor substrate with a laser beam, said laser beam irradiation being performed such that a temperature of the semiconductor substrate raised by the laser beam at a position irradiated by the laser beam does not return to room temperature until a prescribed dose of the second conductivity type impurity element is caused to be doped into the semiconductor substrate.

8. The method according to claim 7, further comprising:
forming a contact region of the first conductivity type having an impurity concentration greater than that of said first semiconductor region of the first conductivity type in the first semiconductor region by bringing said semiconductor substrate into contact with a solution containing a compound of a first conductivity type impurity element and by irradiating said semiconductor substrate with a laser beam, said laser beam irradiation being performed such that a temperature of the semiconductor substrate raised by the laser beam at a position irradiated by the laser beam does not return to room temperature until a prescribed dose of the first conductivity type impurity element is caused to be doped into the semiconductor substrate.

9. The method according to claim 8, further comprising: forming an ohmic electrode layer on said contact region.

10. The method according to claim 6, further comprising:
forming a second semiconductor region of the first conductive type having an impurity concentration greater than that of said first semiconductor region of the first conductivity type in the first semiconductor region by bringing said semiconductor substrate into contact with a solution containing a compound of a first conductivity type impurity element and by irradiating said semiconductor substrate with a laser beam, said laser beam irradiation being performed such that a temperature of the semiconductor substrate raised by the laser beam at a position irradiated by the laser beam does not return to room temperature until a prescribed dose of the first conductivity type impurity element is caused to be doped into the semiconductor substrate.

11. The method according to claim 1, wherein in the step of irradiating said semiconductor substrate with the laser beam, said adjacent end portion of the optical fiber is angled relative to a plane of the primary surface of the said semiconductor substrate such that said one end face of the optical fiber is parallel to the primary surface, and that the laser beam emitted from said one end face of the optical fiber impinges upon the primary surface of said semiconductor substrate in a direction normal to the primary surface of the semiconductor substrate.

12. The method according to claim 1, wherein said one end face of the optical fiber is disposed in parallel with the primary surface of the semiconductor substrate with a distance between said one end face and the primary surface being 0.05 mm to 10.00 mm.

13. An impurity introducing apparatus, comprising:
a solution vessel configured to store therein a solution containing a compound of an impurity element and configured to hold a semiconductor substrate upon a bottom surface thereof;
a support platform that supports the solution vessel; and
a laser optical system, including an optical fiber having one end face configured to be disposed within said solution adjacent to a primary surface of the semiconductor substrate so as to raise a temperature of the primary surface of said semiconductor substrate by inputting a laser beam into the optical fiber and irradiating said semiconductor substrate with the laser beam emerging from said one end face of the optical fiber through the solution located between said one end face and said semiconductor substrate, thereby doping the impurity element into the semiconductor substrate,
wherein in the laser optical system, said one end face of the optical fiber is angled with respect to a longitudinal direction of an adjacent end portion of the optical fiber so that an angle of incidence of the laser beam to said solution is a Brewster angle with respect to said solution.

14. The impurity introducing apparatus according to claim 13, wherein said laser optical system includes a laser light source that emits a continuous-wave laser beam.

15. The impurity introducing apparatus according to claim 13, wherein said laser optical system includes a laser light source that outputs a pulse beam or pulse beams that irradiate said semiconductor substrate such that said raised temperature does not return to room temperature until a prescribed dose of the impurity element is doped into the semiconductor substrate.

16. The impurity introducing apparatus according to claim 14, further comprising:
an X-Y movement stage that freely moves said support platform in an X-Y direction defined within a plane parallel to the primary surface of said semiconductor substrate.

17. The impurity introducing apparatus according to claim 16, further comprising:
a Z movement stage that moves said support platform in a Z direction that is perpendicular to said X-Y direction so as to control a height between said one end face of the optical fiber and a top surface of said semiconductor substrate,
wherein said one end face of the optical fiber is parallel to the top surface of said semiconductor substrate.

18. The impurity introducing apparatus according to claim 17, wherein said laser optical system emits the laser beam at a wavelength having an energy greater than a band gap of said semiconductor substrate.

19. The impurity introducing apparatus according to claim 18, wherein said optical fiber includes a focusing unit therein to focus the inputted laser beam so as to irradiate said semiconductor substrate with the focused laser beam.

20. The impurity introducing apparatus according to claim 15, further comprising:
an X-Y movement stage that freely moves said support platform in an X-Y direction defined within a plane parallel to the primary surface of said semiconductor substrate; and a Z movement stage that moves said support platform in a Z direction that is perpendicular to said X-Y direction so as to control a height between said one end face of the optical fiber and a top surface of said semiconductor substrate, wherein said one end face of the optical fiber is parallel to the top surface of said semiconductor substrate.

21. The impurity introducing apparatus according to claim 13, wherein in said laser optical system, said adjacent end portion of the optical fiber is angled relative to a plane of the primary surface of the said semiconductor substrate such that said one end face of the optical fiber is parallel to the primary surface, and that the laser beam emitted from said one end face of the optical fiber impinges upon the primary surface of said semiconductor substrate in a direction normal to the primary surface of the semiconductor substrate.

22. The impurity introducing apparatus according to claim 13, wherein said one end face of the optical fiber is disposed in parallel with the primary surface of the semiconductor substrate with a distance between said one end face and the primary surface being 0.05 mm to 10.00 mm.

\* \* \* \* \*